(12) United States Patent
Yeh et al.

(10) Patent No.: US 7,730,605 B2
(45) Date of Patent: Jun. 8, 2010

(54) METHOD OF FABRICATING HEAT DISSIPATING APPARATUS

(75) Inventors: Lan-Kai Yeh, Hsinchu (TW); Che-Wei Lin, Hsinchu (TW); Ming-Jye Tsai, Hsinchu (TW); Shao-Wen Chen, Hsinchu (TW); Jin-Cherng Shyu, Hsinchu (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 11/785,326

(22) Filed: Apr. 17, 2007

(65) Prior Publication Data

US 2007/0193029 A1 Aug. 23, 2007

Related U.S. Application Data

(62) Division of application No. 10/995,480, filed on Nov. 24, 2004, now Pat. No. 7,237,337.

(30) Foreign Application Priority Data

Jun. 29, 2004 (TW) ................ 93118983 A

(51) Int. Cl.
*H05B 3/00* (2006.01)
(52) U.S. Cl. .................. 29/611; 29/613; 29/890.03; 29/890.032; 165/80.4; 165/104.26; 165/104.33; 165/185
(58) Field of Classification Search ........... 29/611–613, 29/890.03, 890.032; 165/80.4, 185, 104.26, 165/104.33; 257/712, 715, E23.088
See application file for complete search history.

(56) References Cited

U.S. PATENT DOCUMENTS

| 4,046,190 | A |   | 9/1977  | Marcus et al.            |
| 4,478,277 | A |   | 10/1984 | Friedman et al.          |
| 4,602,679 | A |   | 7/1986  | Edelstein et al.         |
| 5,099,311 | A |   | 3/1992  | Bonde et al.             |
| 5,242,644 | A |   | 9/1993  | Thompson et al.          |
| 5,275,237 | A |   | 1/1994  | Rolfson et al.           |
| 5,386,143 | A | * | 1/1995  | Fitch ............ 257/715 |
| 5,394,936 | A |   | 3/1995  | Budelman                 |
| 5,465,782 | A |   | 11/1995 | Sun et al.               |
| 5,769,154 | A |   | 6/1998  | Adkins et al.            |
| 6,039,114 | A |   | 3/2000  | Becker et al.            |
| 6,082,443 | A | * | 7/2000  | Yamamoto et al. ..... 165/104.26 |

(Continued)

FOREIGN PATENT DOCUMENTS

TW          501722          9/2002

(Continued)

*Primary Examiner*—Thiem Phan
(74) *Attorney, Agent, or Firm*—Rabin & Berdo, P.C.

(57) ABSTRACT

The present invention relates to a method for fabricating a heat dissipating apparatus. The method provides two highly heat conductive members having structure patterns. A highly heat conductive material is coated on the structured patterns for forming a micro-structure layer. The two highly heat conductive members are assembled to form a heat dissipating apparatus having micro-structure layer. The heat dissipating apparatus comprises a main body composed of the highly heat conductive members. The main body forms an accommodating cavity, and inner surfaces of the accommodating cavity form the micro-structure layer. A working fluid is filled into the accommodating cavity for transferring heat from a heat absorbing surface to a heat dissipating surface.

15 Claims, 4 Drawing Sheets

U.S. PATENT DOCUMENTS

| | | |
|---|---|---|
| 6,101,715 A | 8/2000 | Fuesser et al. |
| 6,167,948 B1 | 1/2001 | Thomas |
| 6,257,320 B1 | 7/2001 | Wargo |
| 6,337,794 B1 | 1/2002 | Agonafer et al. |
| 6,415,860 B1 | 7/2002 | Kelly et al. |
| 6,437,981 B1 | 8/2002 | Newton et al. |
| 6,477,045 B1 | 11/2002 | Wang et al. |
| 6,629,559 B2 | 10/2003 | Sachs et al. |
| 6,725,909 B1 | 4/2004 | Luo et al. |
| 6,811,744 B2 | 11/2004 | Keicher et al. |
| 6,935,412 B2 | 8/2005 | Mueller et al. |
| 6,997,244 B2 | 2/2006 | Hul-Chun et al. |
| 2002/0022261 A1 | 2/2002 | Anderson et al. |
| 2002/0056542 A1 | 5/2002 | Yamamoto et al. |
| 2003/0085024 A1 | 5/2003 | Santiago et al. |
| 2003/0213580 A1 | 11/2003 | Philpott et al. |
| 2005/0178317 A1 | 8/2005 | Quake et al. |

FOREIGN PATENT DOCUMENTS

| | | |
|---|---|---|
| TW | 528151 | 4/2003 |

* cited by examiner

METHOD OF FABRICATING HEAT DISSIPATING APPARATUS

CROSS-REFERENCE TO RELATED APPLICATION

This is a division of U.S. application Ser No. 10/995,480, filed Nov. 24, 2004, which claimed Priority from Taiwanese application No. 093118983, filed Jun. 29, 2004, the entire disclosure of which is incorporated herein by reference.

BACKGROUND OF THE INVENTION

1. Field of the Invention

The present invention relates generally to a heat dissipating apparatus having a micro-structure layer and method of fabricating the same, and more particularly, to a heat dissipating apparatus having a micro-structure layer and method of fabricating the same employing a liquid-gas phase transition to dissipate heat.

2. Description of the Related Art

During the last decades, semiconductor fabrication techniques have both reduced the size and increased the functionality of electronic devices, but problems in terms of power consumption, heat dissipation, and reliability have inevitably derived from the process of integrating the electronic devices.

The main reason for the limited reliability of the above devices is that the electronic devices are driven by electricity power that is not fully utilized, and the unused portion of power is converted into heat energy, which dramatically raises the temperature of the whole system incorporating these devices. In the case that the operating temperature goes beyond the range permitted, erratic operation, system failure, and even damage may occur. For the new generation of high-density electronic products, the computation speed and operating frequency of the internal electronic devices thereof is much higher than conventional products. Thus, the amount of heat generated in the course of operation is significantly huge to easily result in their operating temperature exceeding the permitting range. Compounding the problem, along with the trend of miniaturized electronic devices, heat dissipating apparatus has shrunk the size as well to accommodate the desire for smaller products, which presents a big challenge to the fabricating technology in this field in terms of effective heat dissipation and product reliability.

To address the aforementioned problems, a passive cooling mechanism which adopts a liquid-gas phase transition in the fluid is employed in conventional technology. As illustrated in FIG. 5, with liquid-gas phase transition and capillary action in a heat pipe, the heat from a heat absorbing end (heat source) 50 is conducted via evaporation of the liquid to a heat dissipating end 51, and further with condensation of the vapor and capillary pull of the capillary structure, a circulated movement is provided for continually dissipating the heat generated by the electronic devices. Both Taiwanese Patent Publication of 528151 and 501722 disclose such heat dissipating apparatus incorporating the above heat pipe.

The heat dissipating efficiency of the above apparatus is determined by the the capillary structure. If the dimensional precision and distribution of the capillary structures fail to comply with design requirements, the efficiency of the vaporized fluid moving from the heat-absorbing end to the heat-dissipating end may be degraded, and the efficiency of vaporized fluid returning to the heat dissipating end to be re-circulated after heat dissipation may also be degraded. While such heat dissipating apparatus is targeted for using on the miniaturized electronic devices, having the capillary structures dimensioned in micron (μm) scale adds more difficulty to precisely control the fabricating method.

U.S. Pat. No. 4,046,190 discloses a method of fabricating the capillary structure by means of sintered powdered metal. The method is to firstly spread a layer of highly heat conductive metal particles, such as copper, and then sinter under high temperature to form the desired capillary structure. However, a serious drawback associated with the fabrication method is found in the actual production, since the dimension of the capillary structure is not precisely controlled by such sintering method. For a capillary structure with dimensional precision required at the μm scale, the final sintered product usually does not meet the dimensional precision as required in the original design. Therefore, the heat dissipating efficiency is significantly degraded.

To solve the above problem, an injection molding process is adopted in the conventional technology, where injection molding process is performed using sintered copper powder. With characteristics of the injection molding process, the desired capillary structure or channel that fulfills the highly precise geometric dimension requirement is formed, so as to meet the precision requirement of the capillary structures. However, the process described above only solves the problem associated with forming the capillary structure. Other drawbacks remain to be solved, such as the density of the applied copper is relatively low compared to regular plated copper due to the high temperature used in injection molding resulting in a much lower thermal coefficient. Therefore, although heat can be dissipated by liquid-gas phase transition according to the process above, the efficiency of heat dissipation as a whole still awaits further improvement, and current needs for heat dissipating of electronic devices are not satisfied.

Consequently, it is desirable to develop a method for fabricating a heat dissipating apparatus having such a capillary structure layer that can increase the heat dissipation efficiency of the apparatus, wherein the fabricating method is simple and adaptable to rapid mass production.

SUMMARY OF THE INVENTION

To overcome the above drawbacks of conventional technology, an objective of the present invention is to provide a heat dissipating apparatus having a micro-structure layer and a method of fabricating the same, which increase the heat dissipating efficiency thereof.

Another objective of the present invention is to provide a heat dissipating apparatus having a micro-structure layer and method of fabricating the same, which fabricating method is simple and adaptable to mass production.

Still another objective of the present invention is to provide a small scale heat dissipating apparatus having a micro-structure layer and method of fabricating the same.

In accordance with the above and other objectives, the present invention proposes a fabricating method for a heat dissipating apparatus having a micro-structure layer. The method involves providing two highly heat conductive members, surfaces of the two substrates comprising structured patterns; performing injection molding along the structured patterns of the highly heat conductive substrates to form a micro-structure layer on said structured patterns, wherein the micro-structure layer is composed of highly heat conductive material; and assembling said two highly heat conductive substrates to form an accommodating cavity, wherein the accommodating cavity is filled with a working fluid.

In an alternative embodiment, the fabrication method of a heat dissipating apparatus having a micro-structure layer comprises the following steps: providing two highly heat conductive substrates are provided, surfaces of the two substrates comprising structured patterns; forming a highly heat conductive layer on the structure patterns of the highly heat conductive members; performing printing process on said highly heat conductive layer to form a micro-structure layer; and assembling said two highly heat conductive members for forming an accommodating cavity, wherein the accommodating cavity is filled with a working fluid.

Accordingly, the present invention proposes a heat dissipating apparatus having a micro-structure layer. The heat dissipating apparatus comprises of a highly heat conductive member having an accommodating cavity therein; a micro-structure layer formed on an inner wall of the accommodating cavity by injection molding, and the micro-structure is made of highly heat conductive material; and a working fluid for filling the accommodating cavity.

The above micro-structure layer is a capillary structure, which generates a capillary pull for the working fluid that is adhered to and in contact with capillary structure, so as to move the working fluid along an edge of the capillary structure. The capillary structure may be a plurality of parallel grooves or mesh structure with no particular limitation on their manner of arrangements.

The highly heat conductive material may be copper, silver, aluminum, and other heat conductive metals. And the highly heat conductive material is the same as the material for forming the first and second substrate s. The first and second substrates are both made of a highly-dense block, and the first and second substrates have a heat absorbing surface and a heat dissipating surface, respectively.

According to the fabricating method of the present invention, a metal substrate with high heat conduction coefficient is provided, which is further form as a desired high precision micro-structure layer by injection molding or printing. With rapid heat conduction of the substrate and liquid-gas phase transition theory employed in the accommodating cavity, the dissipated heat is rapidly discharged to solve the problems mentioned above of the conventional heat dissipating apparatus.

BRIEF DESCRIPTION OF THE DRAWINGS

The drawings included herein provide a further understanding of the invention. A brief description of the drawings is as follows.

DETAILED DESCRIPTION OF THE PREFERRED EMBODIMENT

Figure 1A:
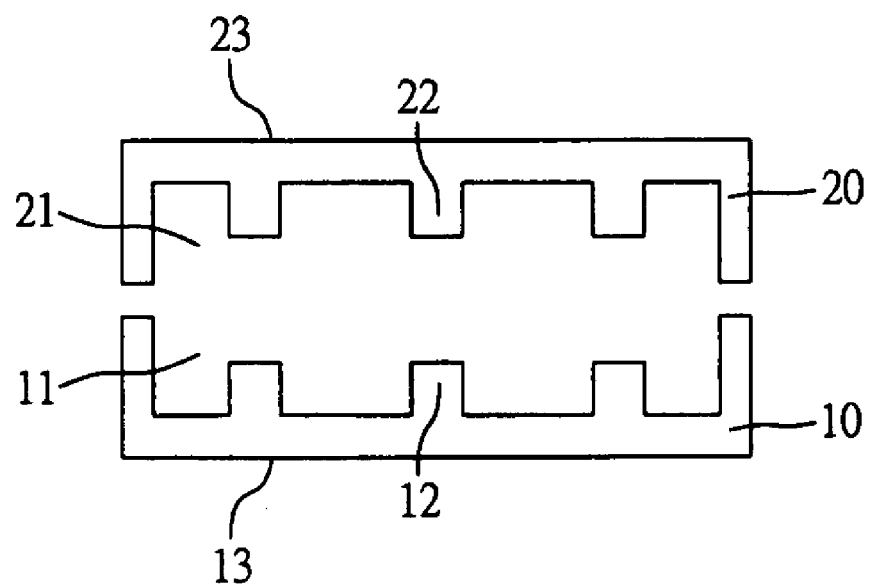
FIGS. 1A to 1C are flow diagrams illustrating a fabrication method for a heat dissipating apparatus in accordance with the present invention.
Figure 1B:
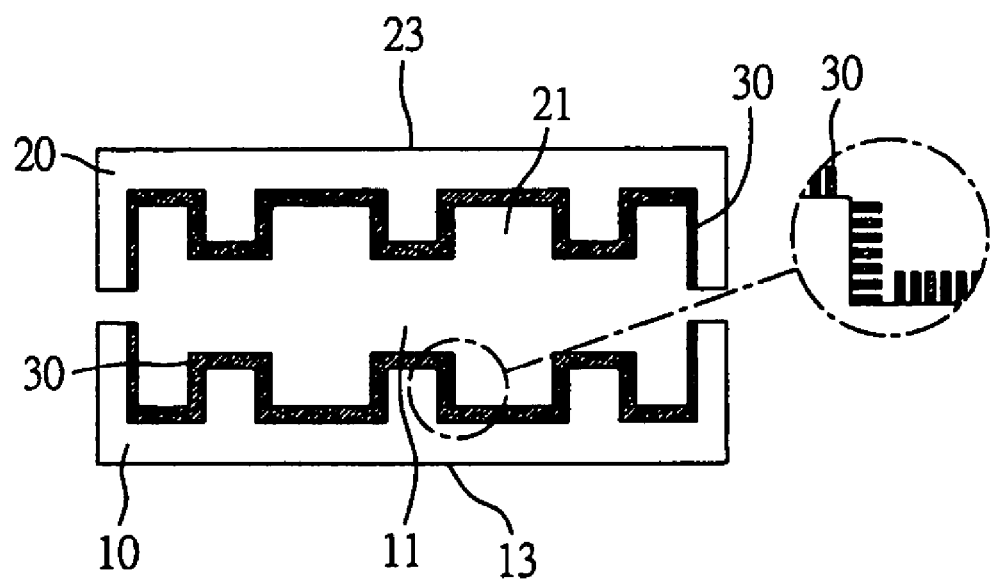
Figure 1C:
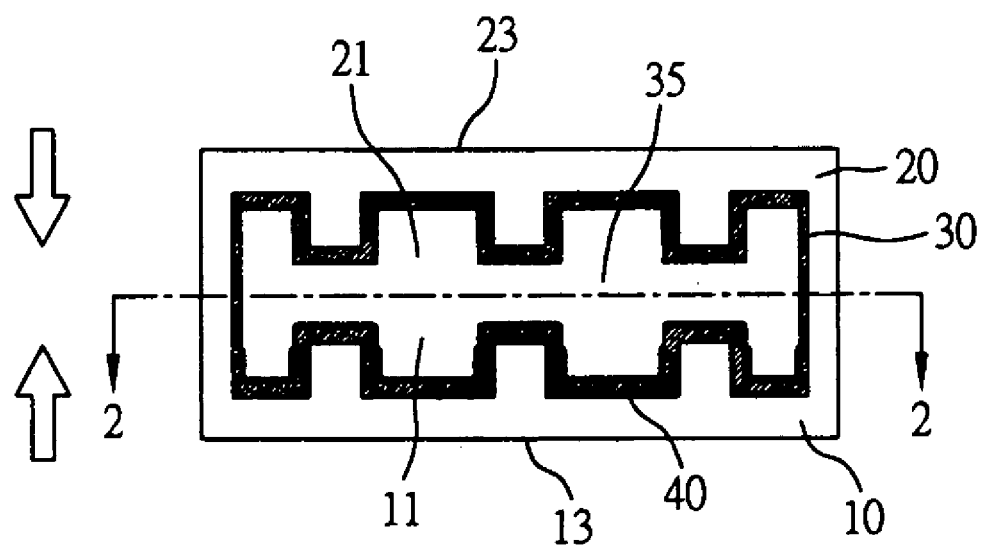

FIGS. 1A to 1C illustrate the fabrication method of a heat dissipating apparatus having a micro-structure layer in accordance with the present invention. Firstly, referring to FIG. 1A, a first substrate 10 and a second substrate 20 of equal dimension are respectively provided. Both of the first substrate 10 and second substrate 20 are made of a highly-dense metal block, and the metal block may be a highly heat conductive material such as copper, silver, aluminum, and so on. The first substrate 10 is defined with a first opening 11 having an inner wall formed with a geometrically structured pattern 12, such that differing profile heights are provided in the inner wall of the first opening 11. In contrast, a continuous heat absorbing surface 13 is defined on an outer surface of the first substrate 10 opposite to the first opening 11. The second substrate 20 comprises a similar structure to that of the first substrate 10. The second substrate 20 is defined with a second opening 21 having an inner wall formed with a geometrically structured pattern 22 positionally opposite that of the structured pattern 12 of the first opening 11. In contrast, a continuous heat dissipating surface 23 is defined on an outer surface of the second substrate 20 opposite to the second opening 21. As illustrated in FIG. 1A, the inner walls of the first and second substrate 10 and 22 respectively form a continuously exposed inner surface thereof.

Then, referring to FIG. 1B, a metal injection molding (MIM) process is performed, wherein highly heat conductive material (such as copper, silver, or aluminum) of the same kind as that of the first substrate 10 and second substrate 20 is made of metal powder and injected under high temperature. The above metal powder is injected into the first opening 11 and second opening 21, for forming a micro-structure layer 30 tightly coating said inner walls of the first opening 11 and second opening 21, respectively. As illustrated in FIG. 1B, the micro-structure layer 30 is evenly formed on the entire inner wall of the first opening 11 and second opening 21, and conforms to differing heights on the structured patterns 12, 22. Simultaneously, the inner walls of the first opening 11 and second opening 21 that are respectively perpendicular to the heat absorbing surface 13 and heat dissipating surface 23 are also formed with said micro-structure layer 30.

Figure 2:
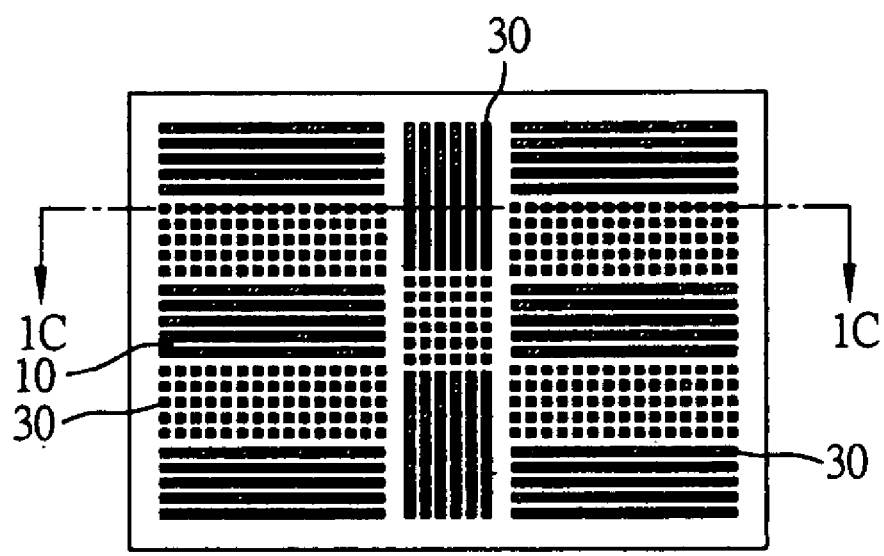
FIG. 2 is an elevation view of a micro-structure layer of the heat dissipating apparatus in accordance with the present invention.

The micro-structure layer 30 functions as a wick or capillary structure to generate a capillary pull for a working fluid that is adhered to and in contact with the capillary structure, so as to move the working fluid along an edge of the capillary structure 30. The capillary structure 30 may be a plurality of parallel grooves or a mesh structure, and there is no particular limitation on the arrangement of grooves or mesh structure, as long as the highly heat conductive capillary micro-structure layer is formed by injection molding. Referring to FIG. 2, an elevation view of the capillary structure 30 according to one preferred embodiment is illustrated. The capillary structure 30 is comprised of a plurality of parallel grooves, wherein the slashed portion is the capillary structure formed by injection molding, and the non-slashed portion represents the inner walls of the first opening 11 or second opening 21.

Referring to FIG. 1C, after injection molding process is performed to form the capillary structure 30, the first substrate 10 and second substrate 20 are assembled together in a manner such that the first opening 11 is brought near to the second opening 21, so that the first opening 11 communicates with the second opening 21 to form a single accommodating cavity 35 therebetween. As clearly shown in FIG. 1C, the heat absorbing surface 13 of the first substrate 10 and the heat dissipating surface 23 of the second substrate 20 are parallel and of equal dimension to each other. The accommodating cavity 35 is filled with a working fluid 40. Therefore, the inner walls of the first opening 11 and second opening 21 forms the inner wall of the accommodating cavity 35, said entire inner wall of the accommodating cavity 35 is thus evenly distributed with the capillary structure 30, and the working fluid 40 fills and freely adheres to the bottom and lateral sides of the capillary structure 30, so as to complete fabrication of the heat dissipating apparatus having micro-structure layer.

The aforementioned working fluid 40 is provided for transmitting heat. So, the working fluid 40 may be selected according to the requirement of dissipating environment, for example, a fluid having an appropriate boiling point or condensation point, such as liquid water, acetone, liquid nitrogen, or ethanol may be selected.

According to the fabricating method of the present invention, the problems associated with conventional method for fabricating the heat dissipating apparatus are solved. Since the main body of the heat dissipating apparatus of the present invention is composed of the metal substrates 10, 20 with high density and high coefficient of heat conduction, the apparatus is very efficient in heat dissipation. In addition, the first and second substrates 10, 20 are further provided with the capillary structure layer 30 formed by injection molding to benefit from the injection molding process is made use of to precisely control the dimension and geometrical configuration of the micro-structure layer 30. The present invention successfully solves the problems that a precise capillary structure cannot be formed by means of sintered powdered metal and the problem of the main body having a low coefficient of heat conduction by fabricating the whole heat dissipating apparatus by injection molding.

In addition, the fabrication method of the present invention employs injection molding only to form the desired micro-structure layer 30 on the first and second substrates 10, 20, which is simple and adapted to mass production. The heat dissipating apparatus of the present invention can be made to a considerably small scale, thus keeping up with the trend of miniaturization of electronic elements Alternatively, in addition to injection molding, the micro-structure layer 30 of the present invention can also be formed by press-printing. A highly heat conductive material layer is firstly formed on the structured patterns 12, 22 of the first and second substrates 10, 20. Said highly heat conductive material layer is then subjected to a printing process to form the micro-structure layer 30.

Figure 3:
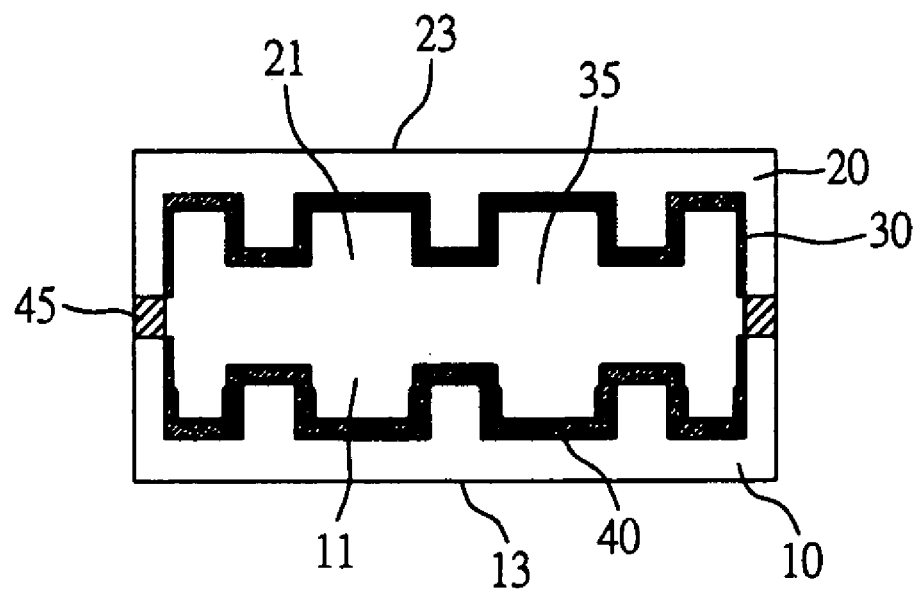
FIGS. 3 and 4 are cross-sectional views of the heat dissipating apparatus in accordance with other embodiments of the present invention.

Referring to FIG. 3, a ring-shaped frame 45 having the same peripheral shape configuration with the first and second substrates 10, 20 is provided and arranged between the first and second substrates 10, 20, for interconnecting the first and second substrates 10, 20, and increasing the height of the heat dissipating apparatus to enlarge the accommodating cavity 35.

Figure 4:
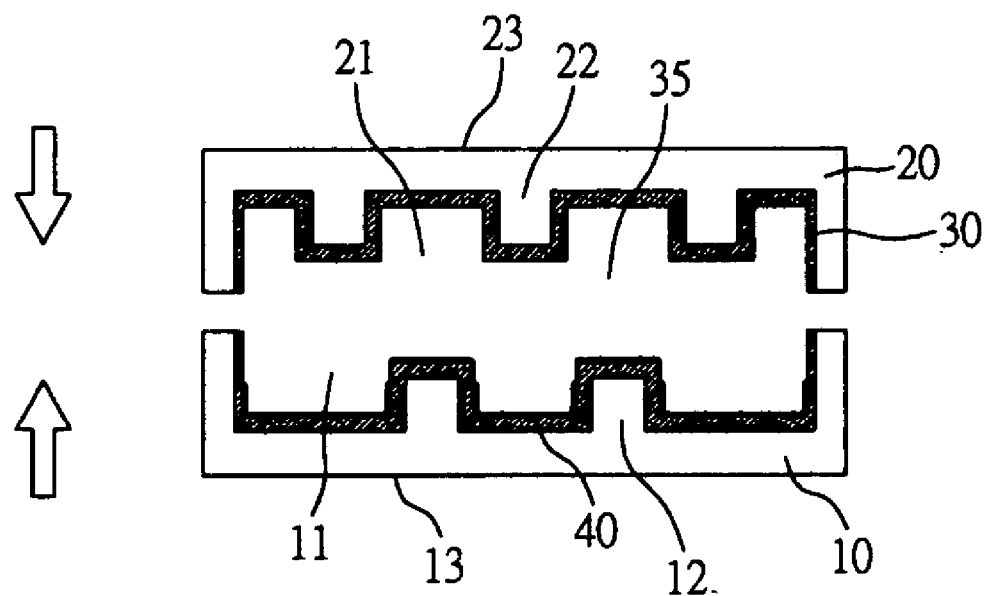
Figure 5:
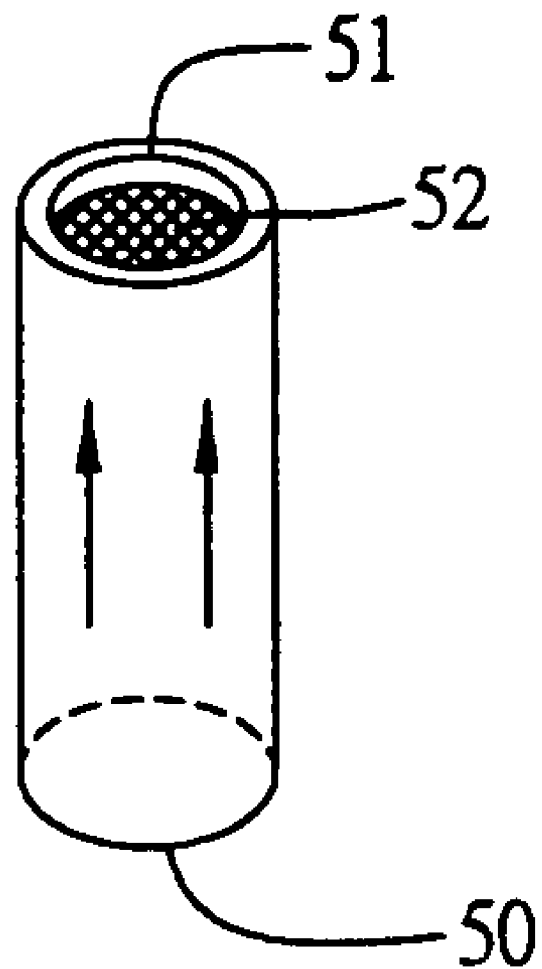
FIG. 5 is a schematic view of a liquid-gas phase transition type of the conventional heat dissipating apparatus.

It is not necessary for the structured patterns 12, 22 of the first and second substrates 10, 20 to be identical. Referring to FIG. 4, in an alternative embodiment, the first and second substrates 10, 20, respectively may comprise structured patterns 12, 22 of a different configuration, as long as an accommodating cavity 35 is formed therebetween after the first and second substrates 10, 20 are assembled.

Therefore, the heat dissipating apparatus fabricated by the fabrication method of the present invention meets the heat dissipating demands of small scale electronic devices. The heat dissipating apparatus is affixed on a heat source (such as an electronic device), and the heat absorbing surface 13 is contact with said heat source. The heat absorbing surface absorbs the heat because of a temperature differential between the heat-absorbing surface and the surface of the heat source with which it is in contact. Thus, heat from the heat source enters into the accommodating cavity 35 via the heat absorbing surface 13. Because the first substrate 10 is made of a very dense and highly heat conductive material, conduction of heat into the accommodating cavity 35 is very efficient. After the heat enters into the accommodating cavity 35, the working fluid 40 in the capillary micro-structure layer 30 at the bottom of the accommodating cavity 35 absorbs the heat and is then vaporized to move to the top portion of the accommodating cavity 35. Then, the heat of the working fluid 40 is released in the top portion of the accommodating cavity 35 upon condensation where the heat is then absorbed by the second substrate 20 and subsequently dissipated to the outside environment via the heat dissipating surface of the second substrate 20. The efficiency of heat dissipating is also improved through the highly heat conductive material of the second substrate 20.

As the heat is dissipated via the heat dissipating surface 23, the evaporated gas from the working fluid 40 is condensed into liquid. Because of gravity and the capillary force of the capillary micro-structure layer 30, said liquid is pulled down to the bottom of the accommodating cavity 35 to be vaporized again, thus forming circulation. The description above is the heat dissipating theory of the heat dissipating apparatus of the present invention, which has a high heat dissipating efficiency and complies with the heat dissipating requirements of electronic devices.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A method of fabricating a heat dissipating apparatus having only one accommodation cavity, comprising:
   providing two highly heat conductive substrates, each of the two substrates having an outer surface and continuously exposed inner surface formed with structured patterns;
   forming a highly heat conductive layer on the structured patterns of the highly heat conductive substrates;
   forming a micro-structure layer from said highly heat conductive layer; and
   assembling said two highly heat conductive substrates to form the only one accommodating cavity having the micro-structure layer formed with different profile heights from the structured patterns, thereby forming the heat dissipating apparatus having the micro-structure layer of a precise geometric dimension that corresponds to the structured patterns, wherein
   the single accommodating cavity is filled with a working fluid, and the working fluid is adhered to a portion of the micro-structure layer with a lowest profile height in the highly heat conductive substrates of all the continuously exposed inner surface of each of the two substrates; and
   the two outer surfaces are parallel and of equal dimension to each other.

2. The method as claimed in claim 1, wherein the micro-structure layer is a capillary micro-structure.

3. The method as claimed in claim 2, wherein the capillary micro-structure is selected from a plurality of parallel grooves or a mesh structure.

4. The method as claimed in claim 1, wherein a material for the highly heat conductive layer is selected from a group consisting of copper, silver, and aluminum.

5. The method as claimed in claim 1, wherein the highly heat conductive substrate is selected from a group consisting of a copper block, a silver block, and an aluminum block.

6. The method as claimed in claim 1, wherein the working fluid is one selected from a group consisting of liquid water, acetone, liquid nitrogen, and ethanol.

7. The method of fabricating a heat dissipating apparatus of claim 1, wherein the inner surface of each of the respective substrates comprises a plurality of crenellated teeth defining the structured patterns.

8. The method of fabricating a heat dissipating apparatus of claim 7, wherein the crenellated teeth of one of the substrates face and are in alignment with the crenellated teeth of the other one of the substrates.

9. The method of fabricating a heat dissipating apparatus of claim 7, wherein the crenellated teeth of one of the substrates face and are disposed in alignment with respective crenels of the other one of the substrates.

10. The method of fabricating a heat dissipating apparatus of claim 7, wherein the crenellated teeth of one of the substrates are not in contact with the inner surface of the other one of the substrates, thereby forming the only one accommodating cavity between the substrates.

11. A method of fabricating a heat dissipating apparatus having only one accommodation cavity, comprising:
 providing two highly heat conductive substrates, each of the two substrates having an outer surface and a continuously exposed inner surface formed with a structured pattern;
 forming a highly heat conductive layer on the structured pattern of each substrate;
 forming a micro-structure layer from said highly heat conductive layer; and
 assembling said two highly heat conductive substrates to form the only one accommodating cavity, the single accommodating cavity having the micro-structure layer formed with different profile heights resulting from the structured patterns, thereby forming the heat dissipating apparatus having a micro-structure of a precise geometric dimension that corresponds to the structured patterns, and the two outer surfaces being parallel and of equal dimension to each other.

12. The method of fabricating a heat dissipating apparatus of claim 11, wherein the inner surface of each of the respective substrates comprises a plurality of crenellated teeth defining the structured patterns.

13. The method of fabricating a heat dissipating apparatus of claim 12, wherein the crenellated teeth of one of the substrates face and are in alignment with the crenellated teeth of the other one of the substrates.

14. The method of fabricating a heat dissipating apparatus of claim 12, wherein the crenellated teeth of one of the substrates face and are disposed in alignment with respective crenels of the other one of the substrates.

15. The method of fabricating a heat dissipating apparatus of claim 12, wherein the crenellated teeth of one of the substrates are not in contact with the inner surface of the other one of the substrates, thereby forming the only one accommodating cavity between the substrates.

* * * * *